(12) United States Patent
Iwasaki et al.

(10) Patent No.: US 6,295,221 B1
(45) Date of Patent: Sep. 25, 2001

(54) METHOD OF MANUFACTURING CARD-TYPE STORAGE DEVICE AND CARD-TYPE STORAGE DEVICE

(75) Inventors: Hiroshi Iwasaki, Yokohama; Osami Suzuki, Tokyo, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/494,048

(22) Filed: Jan. 31, 2000

(30) Foreign Application Priority Data

Sep. 16, 1999 (JP) .................................................. 11-262724

(51) Int. Cl.$^7$ .......................... B42D 15/10; G06K 19/077
(52) U.S. Cl. ........................... 365/63; 257/725; 257/726; 257/727; 29/830; 29/832; 29/846; 29/856; 29/858; 361/728; 361/737; 361/757; 361/807; 361/809
(58) Field of Search ................................ 365/63; 257/725, 257/726, 727; 29/830, 832, 846, 856, 858; 361/728, 737, 752, 807, 809

(56) References Cited

U.S. PATENT DOCUMENTS 5,276,831 * 1/1994 Nakanishi et al. ................... 395/425
5,423,424 * 6/1995 Young, III ............................. 206/425
5,550,709   8/1996 Iwasaki .
6,091,145 * 7/2000 Clayton ................................ 257/724

FOREIGN PATENT DOCUMENTS

| 404010299A | * | 1/1992 | (JP) . |
| 404358897A | * | 12/1992 | (JP) . |
| 405131788A | * | 5/1993 | (JP) . |
| 407025186A | * | 1/1995 | (JP) . |
| 08-212017 |   | 8/1996 | (JP) . |
| 10-147088 |   | 6/1998 | (JP) . |
| 10-147089 |   | 6/1998 | (JP) . |
| 10-166771 |   | 6/1998 | (JP) . |
| 410287069A | * | 10/1998 | (JP) . |

\* cited by examiner

*Primary Examiner*—Viet Q. Nguyen
(74) *Attorney, Agent, or Firm*—Finnegan, Henderson, Farabow, Garrett & Dunner, L.L.P.

(57) ABSTRACT

A method of manufacturing a small, thin card-type storage device is capable of easily manufacturing a frame for the storage device from a variety of resin materials without molding a very thin recessed bottom of the supporter. The method prepares a card-type support frame member from resin and a sheet material, cuts the sheet material into the size of the support frame member, to form a support sheet, bonds the support sheet to a bottom surface of the support frame member, to form a frame, and fits a memory module to be fixed in an opening of the support frame member in the frame, thereby completing the card-type storage device.

57 Claims, 15 Drawing Sheets

METHOD OF MANUFACTURING CARD-TYPE STORAGE DEVICE AND CARD-TYPE STORAGE DEVICE

BACKGROUND OF THE INVENTION

1. Field of the Invention

The present invention relates to a method of manufacturing a card-type storage device and a card-type storage device. In particular, the present invention relates to a technique for facilitating manufacturing a frame that supports a semiconductor memory, and for enabling the storage device itself to indicate contents stored in the storage device, in a thin type card-type storage that incorporates a semiconductor memory.

2. Description of the Background Art

FIGS. 1 and 2 show the structure of a conventional standard card-type storage device, in which FIG. 1 is a perspective view and FIG. 2 a sectional view.

This type of storage device is disclosed in, for example, U.S. Pat. No. 5,550,709.

A conventional technique for manufacturing such a card-type storage device injection-molds a card-type frame 111 of solid body from plastic. The frame 111 has an opening 111a to receive a memory module 113. The memory module 113 has a semiconductor memory 113a and a flat electrode 113b and is fitted into the opening 111a of the frame 111 to be fixed such that the flat electrode 113b is exposed.

Above-mentioned conventional technique for manufacturing the car-type storage device, however, has the following problems.

Apparatuses such as digital cameras that employ card-type storage devices are becoming smaller, and therefore, the card-type storage devices are required to be smaller and thinner. In the thin storage device of FIGS. 1 and 2, the frame 111, which is injection-molded into solid body, must have a very thin recessed bottom 111b under the opening 111a for receiving the memory module 113. To form such a thin bottom 111b, a precision metal mold must be prepared through difficult processes, and the inside of the metal mold must be kept under a low pressure when injecting resin into it. This complicates the structure of a molding mechanism and makes the resin injection work difficult.

There is a risk of injection-molding the thin bottom 111b into an unwanted shape depending on resin material used for the frame 111. More particularly, to correctly form the thin bottom 111b, molten resin must be injected into the corners of a metal mold. To achieve this, the resin must be heated to reduce the viscosity thereof and must be injected into the injection point of the metal mold with great pressure. At this time, however, the resin will burn due to frictional heat if the resin has low heat resistance. If heat-resistive resin is used to avoid the problem, it may deform the thin bottom 111b because the heat-resistive resin has high viscosity.

There are only limited resin materials that may correctly form a card-type frame having a thin recessed bottom. Such materials include MULTIRON TN-3813-B of Teijin Chemical Company. This resin material, however, has limited applications because it is incapable of forming transparent or translucent card-type frame that withstands a high temperature of 100 degrees centigrade or higher.

In this way, the conventional technique is hardly capable of manufacturing thin, small card-type storage devices having a thin recessed bottom 111b.

Making a card-type storage device with transparent or translucent material provides an advantage to show an image printed on the storage device to a user so that the user may easily recognize the contents of information stored therein, as a characteristic of above mentioned card-type storage device. However, the conventional technique allows only limited materials to form card-type frame 111 of solid body. Accordingly, the conventional technique is unable to freely form transparent or translucent card-type storage devices to meet various applications for card-type frame thereof.

SUMMARY OF THE INVENTION

An object of the present invention is to provide a method of manufacturing a small, thin card-type storage device, capable of easily manufacturing a frame for the storage device from a variety of resin materials without forming a very thin recessed bottom of the frame.

Another object of the present invention is to provide a card-type storage device enabling the storage device to indicate contents stored therein.

In order to accomplish the objects, the present invention forms a card-type storage device frame with a sheet and a support frame member. The sheet and support frame member may be made of transparent or translucent material.

More precisely, one aspect of the present invention provides a method of manufacturing a card-type storage device, including the steps of (a) preparing a card-type support frame member having an opening, (a') preparing a sheet material, (b) cutting the sheet material into the size of the support frame member, to form a support sheet, (c) bonding the support sheet to a bottom surface of the support frame member, to form a frame, and (d) fitting a memory module to be fixed in the opening of the support frame member in the frame. The memory module has at least one semiconductor memory sealed therein on a first surface of the memory module and a flat external terminal exposed on a second surface of the memory module. The memory module is fitted in the opening of the support frame member in the frame such that the second surface thereof aligns with a top surface of the frame.

Another aspect of the present invention provides a method of manufacturing a card-type storage device, including the steps of (aa) preparing a card-type support frame member having an opening, (aa') preparing a sheet material, (bb) bonding a bottom surface of the support frame member onto the sheet material, (cc) cutting the sheet material along the support frame member, to form a frame made of the support frame member and the cut sheet material serving as a support sheet attached to the bottom surface of the support frame member, and (dd) fitting a memory module to be fixed in the opening of the support frame member in the frame. The memory module has at least one semiconductor memory sealed therein on a first surface of the memory module and a flat external terminal exposed on a second surface of the memory module.

Another aspect of the present invention provides a method of manufacturing card-type storage devices, including the steps of (aaa) preparing, from resin, a frame member set made of consecutively joined card-type support frame members each having an opening, as well as a sheet material whose size is substantially equal to or larger than the frame member set; (bbb) bonding a bottom surface of the frame member set onto the sheet material, (ccc) cutting the frame set along the support frame members to simultaneously form frames each made of the support frame member and the cut sheet material serving as a support sheet attached to the bottom surface of the support frame member, and (ddd) fitting a memory module to be fixed in the opening of the support frame member of each of the frames. The memory module has at least one semiconductor memory sealed with resin on a first surface of the memory module and a flat external terminal exposed on a second surface of the memory module.

Another aspect of the present invention provides a method of manufacturing a card-type storage device, including a card-type support frame member made of resin and having an opening, a support sheet bonded to a bottom surface of the support frame member, and a memory module having at least one semiconductor memory sealed with resin on a first surface of the memory module and a flat external terminal exposed on a second surface of the memory module. The method includes the steps of (a) preparing the support frame member and a sheet material, (b) cutting the sheet material into the size of the support frame member, to form the support sheet, (c) bonding the support sheet to the bottom surface of the support frame member, to form a frame, and (d) fitting the memory module to be fixed in the opening of the support frame member in the frame.

Another aspect of the present invention provides a card-type storage device having a card-type support frame member having an opening and made of transparent or translucent material, a support sheet bonded to a bottom surface of the support frame member, and a memory module having at least one semiconductor memory sealed therein on a first surface of the memory module and a flat external terminal exposed on a second surface of the memory module. The card-type storage device is manufactured by the steps of (a") preparing the support frame member and a sheet material, (b") cutting the sheet material into the size of the support frame member, to form the support sheet, (c") bonding the support sheet to the bottom surface of the support frame member, to form a frame, and (d") fitting the memory module to be fixed in the opening of the support frame member in the frame.

Another aspect of the present invention provides a card-type storage device having (a) a frame and (b) a memory module. The frame includes a card-type support frame member having an opening and made of resin, and a support sheet bonded to a bottom surface of the support frame member. The support frame member bottomed with the support sheet forms the frame. The memory module includes at least one semiconductor memory sealed therein on a first surface of the memory module and a flat external terminal exposed on a second surface of the memory module.

Other features and advantages of the present invention will become apparent from the following description taken in conjunction with the accompanying drawings.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DESCRIPTION OF THE PREFERRED EMBODIMENTS

Now, the preferred embodiments of the methods of manufacturing card-type storage devices and the card-type storage devices themselves according to the present invention will be explained in detail with reference to FIGS. 3 to 24.

First Embodiment

Figure 3:
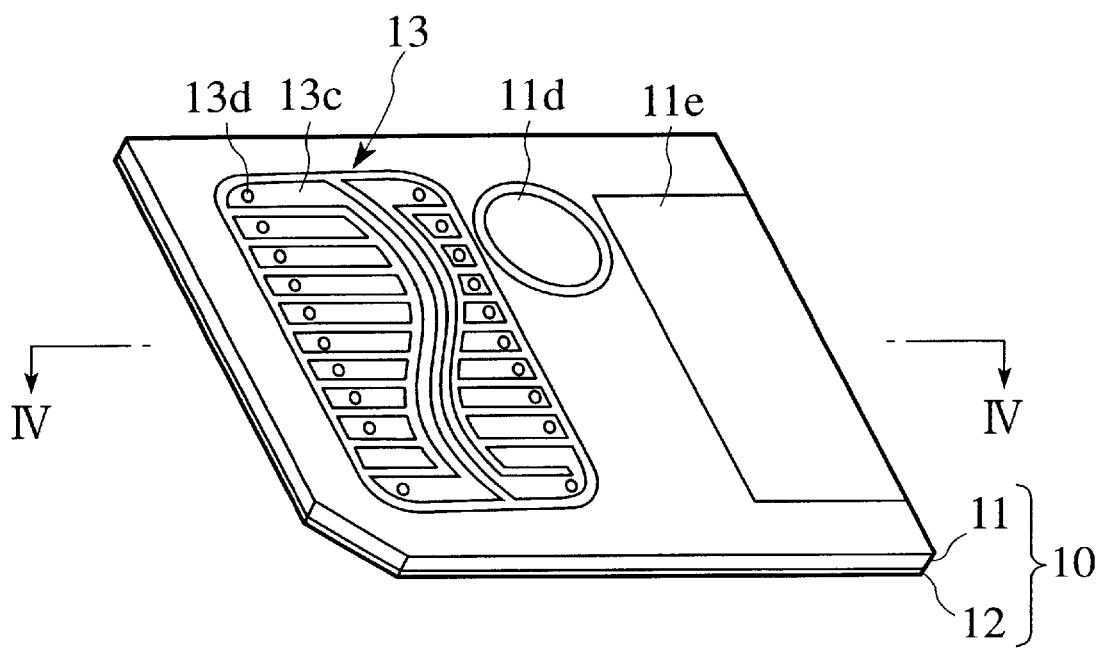
FIG. 3 is a perspective view showing a card-type storage device manufactured according to a method of a first embodiment of the present invention.
Figure 4:
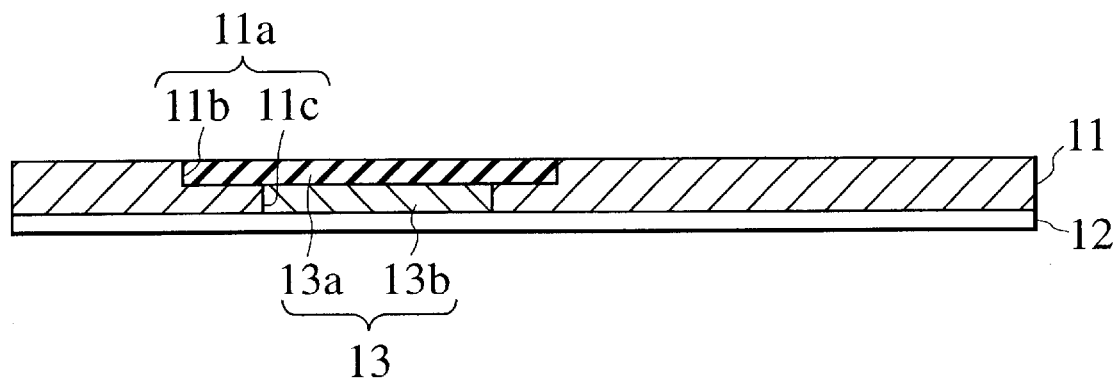
FIG. 4 is a sectional view taken along line IV—IV of FIG. 3 showing a card-type storage device manufactured according to a method of a first embodiment of the present invention.
Figure 5:
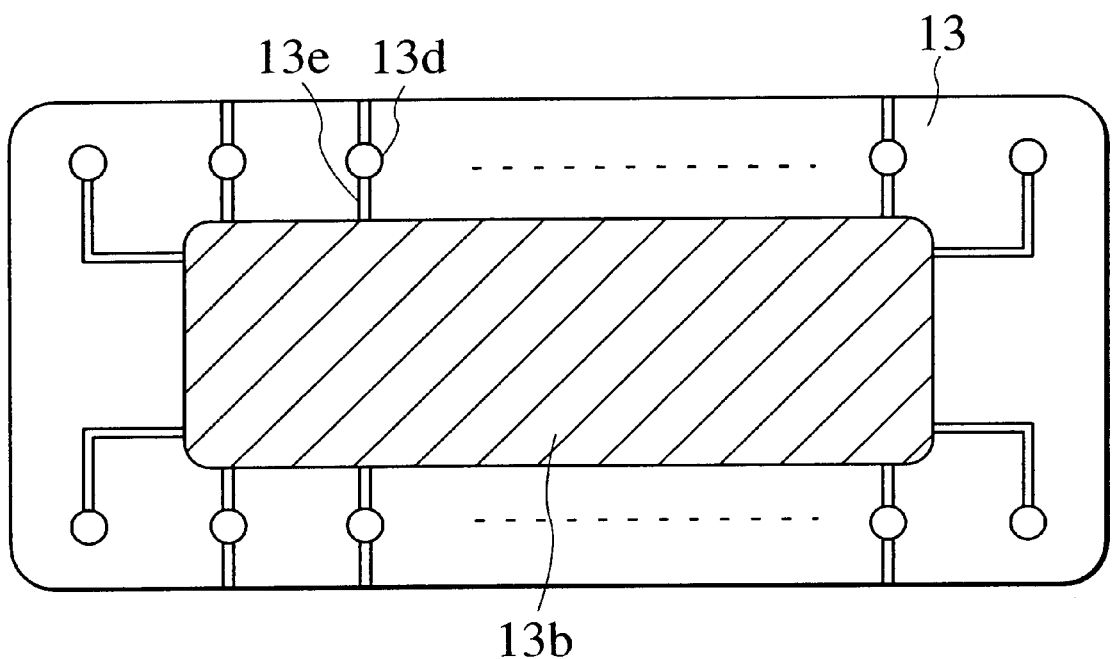
FIG. 5 shows a first surface of a memory module shown in FIG. 3.

FIG. 3 is a perspective view showing a card-type storage device manufactured according to the first embodiment of the present invention and FIG. 4 is a sectional view taken along a line IV—IV of FIG. 3. FIG. 5 shows a first surface of a memory module installed in the storage device of FIGS. 3 and 4.

This storage device is a so-called "SmartMedia" (that is registered trademark), which is a small, thin card-type storage device. The storage device comprises the memory module 13 of about, for example, 0.665 mm thick and a card-type frame 10 of about 0.76 mm ±0.08 mm thick.

The frame 10 comprises a card-type support frame member 11 made of resin having an opening 11a, and a support sheet 12 bonded to a bottom surface of the support frame member 11. The opening 11a consists of a recess 11b and a through hole 11c that is formed at the bottom of the recess 11b and is smaller than the recess 11b. Making the through hole 11c smaller than the recess 11b is to firmly fit a semiconductor memory 13b of the memory module 13 to be fixed in the opening 11a. The support frame member 11 has a write-protect area 11d for prohibiting data in the memory 13b from being rewritten, and a label area 11e.

The memory module 13 has a circuit board 13a having first and second surfaces. The semiconductor memory 13b is sealed with resin on the first surface of the circuit board 13a. Each connection terminal of the semiconductor memory 13b is connected to a wire 13e, which is connected to a through hole 13d. The through hole 13d is connected to a flat external terminal 13c, which is arranged on the second surface of the circuit board 13a. The memory module 13 is fitted to the support frame 11 such that the second surface of the memory module 13 aligns with a top surface of the support frame member 11.

The memory module 13 fits to be fixed in the opening 11a of the frame 10 such that the flat external terminal 13c is exposed. More precisely, as shown in FIG. 4, the circuit board 13a is engaged in the recess 11b of the opening 11a, and the terminal 13c is flush with and exposed from the top surface of the frame 10. At the same time, the semiconductor memory 13b fits to be fixed in the through hole 11c. Namely, the recess 11b and through hole 11c of the opening 11a form a stepped structure to properly hold the semiconductor memory 13b and the terminal 13c of the memory module 13. The semiconductor memory 13b is, for example, a flash memory or a mask ROM.

Next, a method of manufacturing the card-type storage device according to the first embodiment will be explained with reference to FIGS. 6 to 11.

Figure 6:
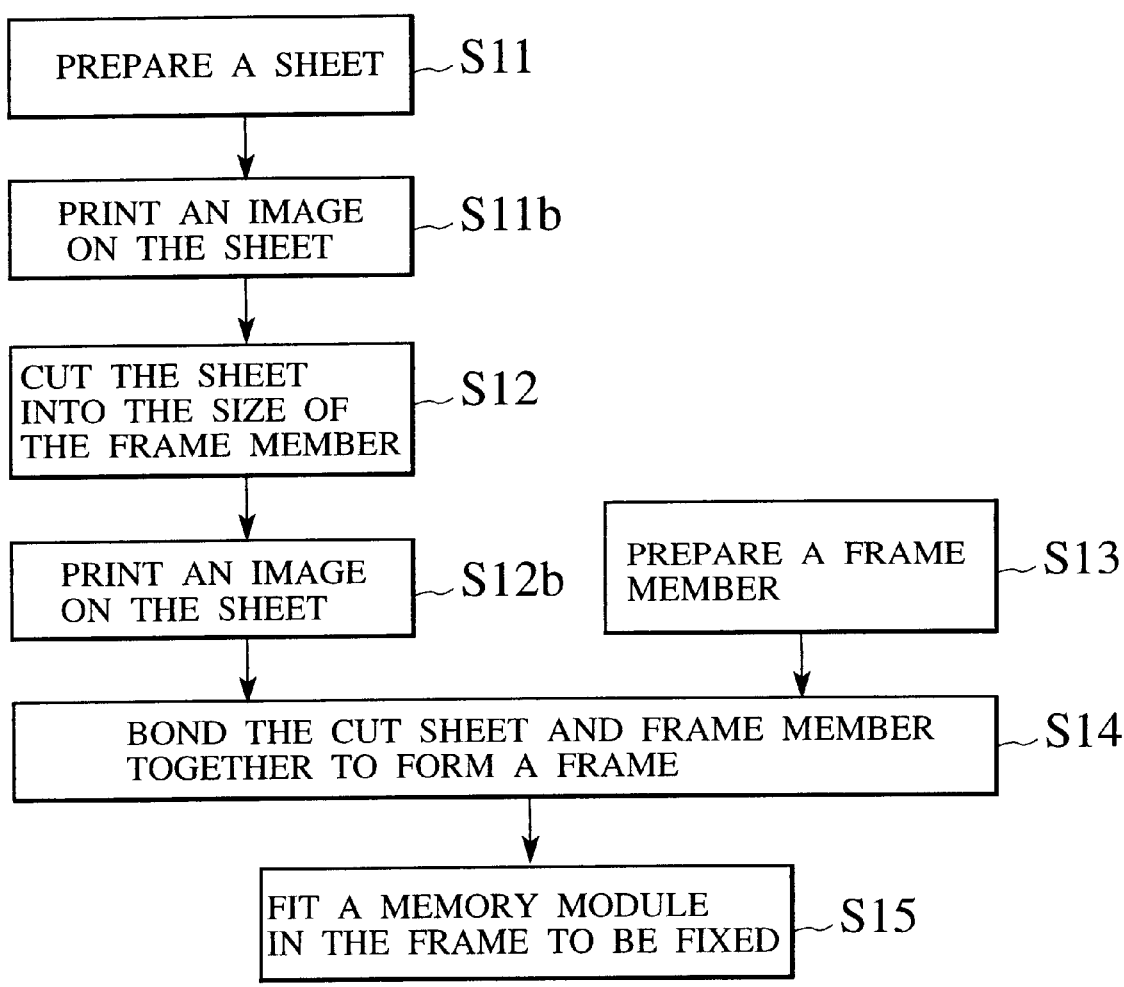
FIG. 6 is a process diagram generally showing the process procedures according to the first embodiment.
Figure 7:
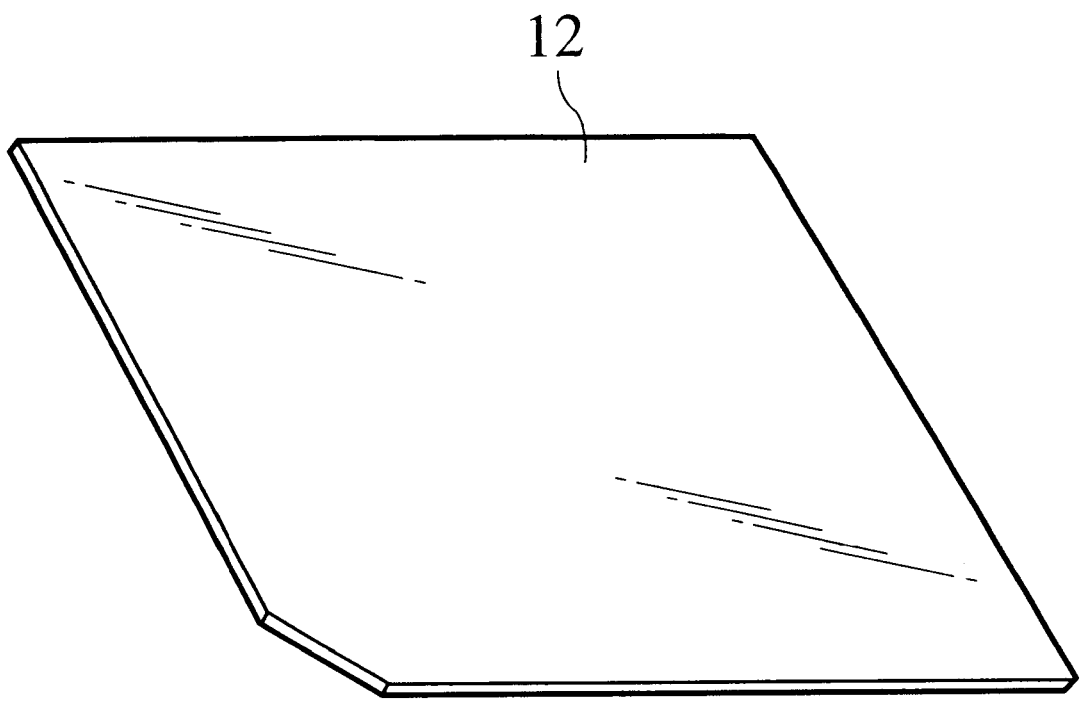
FIG. 7 is a perspective view showing a support sheet according to the first embodiment.
Figure 8:
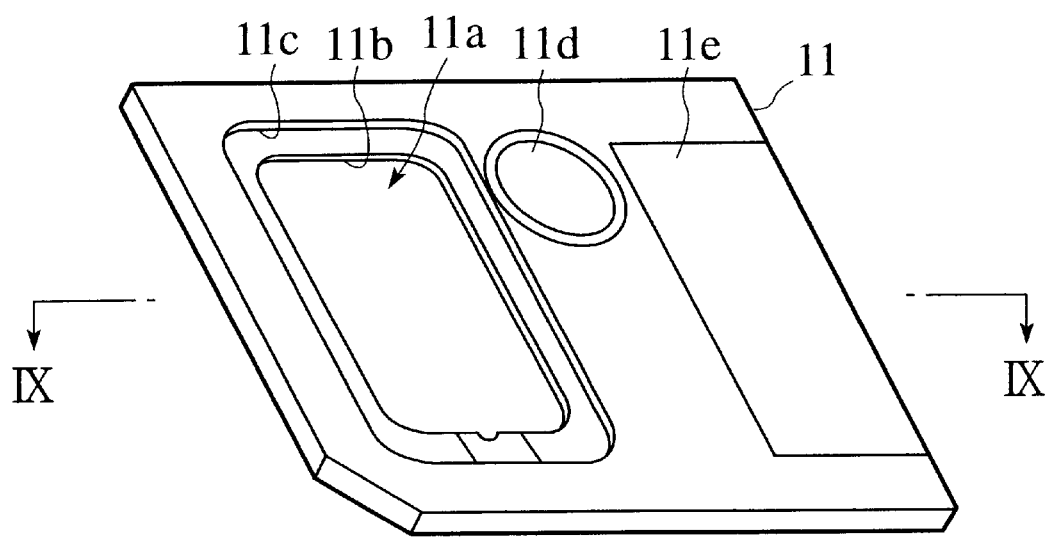
FIG. 8 is a perspective view showing a card-type support frame member according to the first embodiment.
Figure 9:
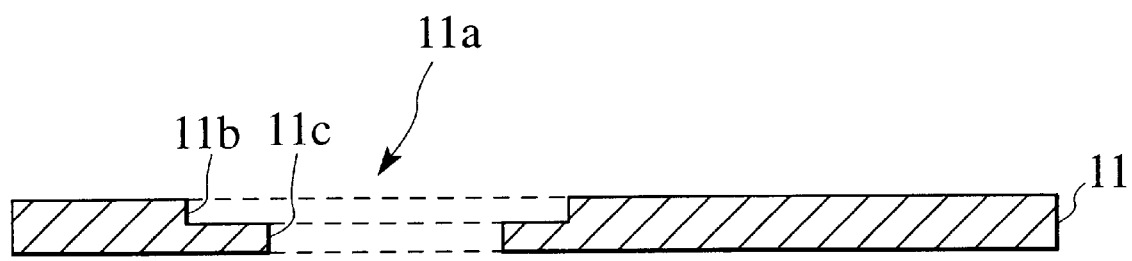
FIG. 9 is a sectional view taken along line IX—IX of FIG. 8 showing the card-type support frame member according to the first embodiment.
Figure 10:
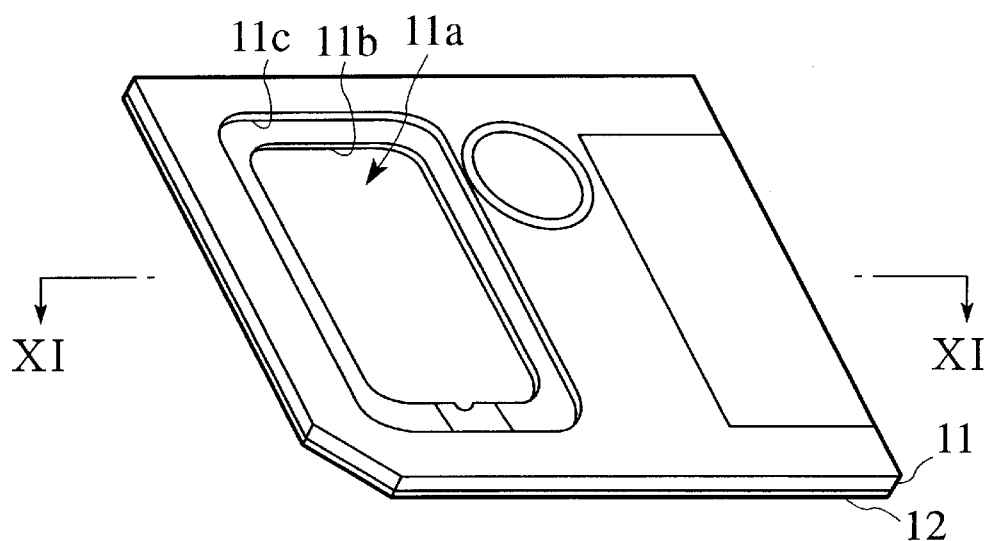
FIG. 10 is a perspective view showing a card-type frame according to the first embodiment.
Figure 11:
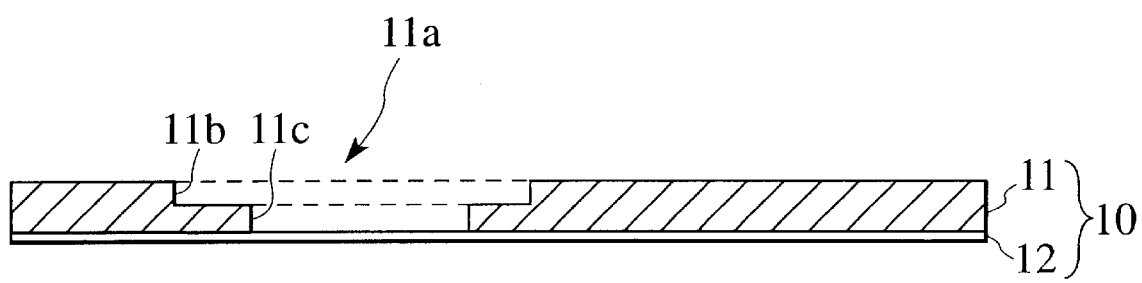
FIG. 11 is a sectional view taken along line XI—XI of FIG. 10 showing a card-type frame according to the first embodiment.
Figure 12:
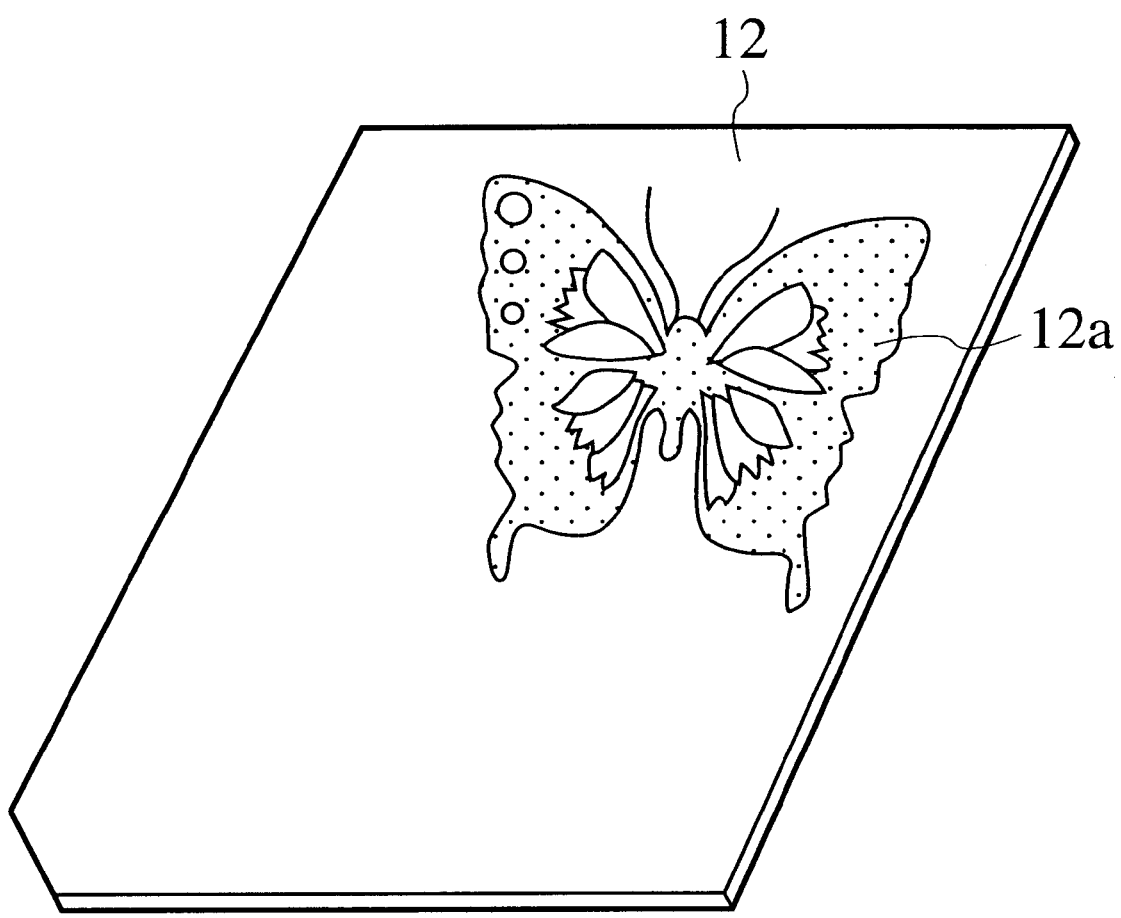
FIG. 12 is a perspective view showing a support sheet with a printed image.

FIG. 6 is a process diagram generally showing the manufacturing method of the first embodiment. FIGS. 7 to 11 show manufacturing steps according to the first embodiment. FIG. 8 is a perspective view showing the card-type support frame member 11 and FIG. 9 is a sectional view taken along a line IX—IX of FIG. 8. FIG. 10 is a perspective view showing the card-type frame 10 and FIG. 11 is a sectional view taken along a line XI—XI of FIG. 10.

Step S11 prepares a sheet material of 0.10 mm to 0.17 mm thick. Step S12 cuts the sheet material into the size of the card-type support frame member 11, to form a support sheet 12 shown in FIG. 7, for example. At the same time, step S13 prepares the support frame member 11 having the opening 11a by, for example, injection molding as shown in FIGS. 8 and 9. The thickness of the support frame member 11 is, for example, about 0.665 mm, which is the same as the thickness of the memory module 13.

Step S14 bonds the support sheet 12 to a bottom surface of the support frame member 11 with the use of adhesive agent, for example, to form the card-type frame 10 as shown in FIGS. 10 and 11. In the frame 10, the bottom of the opening 11a of the support frame member 11 is closed with the support sheet 12. It is necessary to precisely align the support sheet 12 with the support frame member 11.

The last step S15 fixes the memory module 13 in the opening 11a of the frame 10 with the use of, for example, adhesive agent, thereby completing the card-type storage device shown in FIG. 3.

Figure 1:
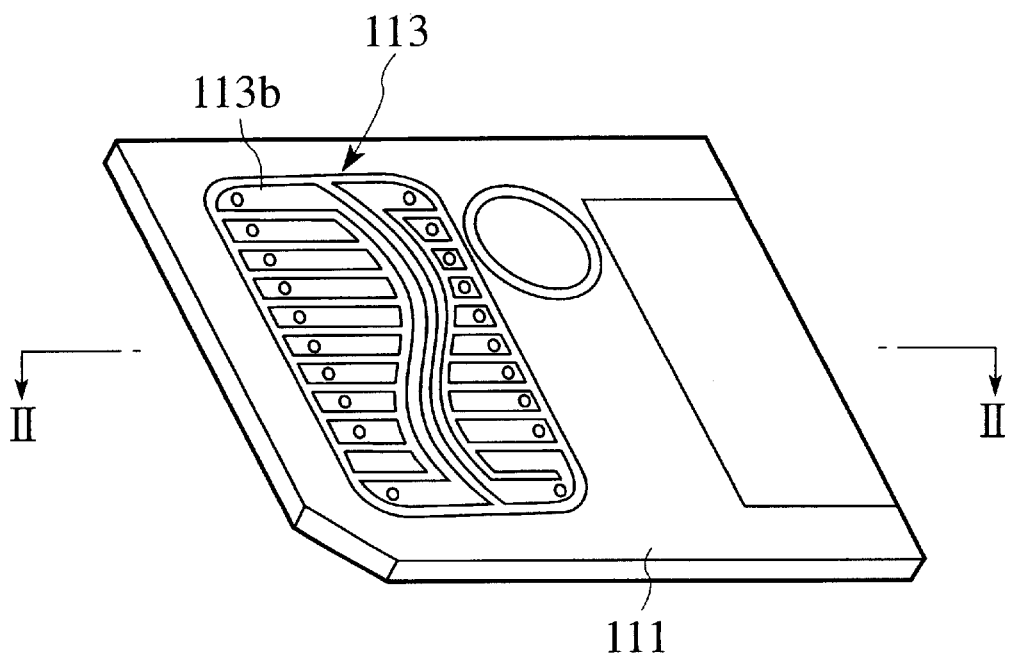
FIG. 1 is a perspective view showing a conventional standard card-type storage device.
Figure 2:
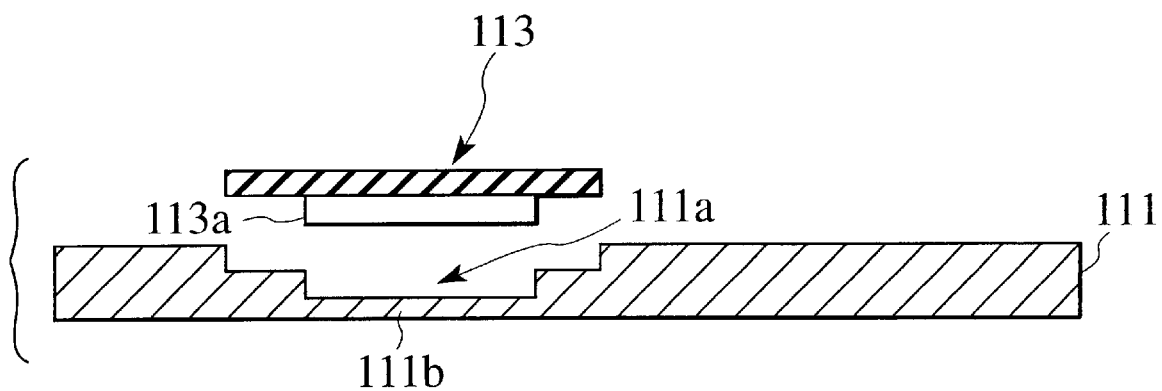
FIG. 2 is a sectional view taken along line II—II of FIG. 1 showing a conventional standard card-type storage device.

When the thickness of the storage device must be equalized to that of a bank card or credit card, i.e., about 0.76 mm ±0.08 mm, the recess bottom 111b should be formed (FIG. 2) to 0.13 mm to 0.15 mm. Therefor, it is nearly impossible for the conventional technique to form the card-type supporter having such a thin recess bottom by injection molding from transparent or translucent material with respect to the above "SmartMedia".

On the other hand, the manufacturing method of the first embodiment is capable of forming a small, thin card-type frame 10 without molding a very thin part of 0.2 mm thick or thinner from resin material even with small and thin card-type storage device such as "SmartMedia". As a result, the frame 10 of the first embodiment is manufacturable with the use of existing metal molds and injection molding machines. The frame 10 of the first embodiment is easily molded from an extended range of resin materials including transparent and translucent resin materials. Accordingly, the support frame member 11 and support sheet 12 that form the frame 10 may easily be formed to be transparent or translucent. When the frame 10 is transparent or translucent, an image that indicates and displays contents stored in the memory module 13 may be printed on the frame 10, so that a user may easily recognize the contents stored in the card-type storage device. In other words, the first embodiment enables a card-type storage device to have an indication of contents stored in the storage device. The indication may be an image representing contents such as music, book text, images, or voice reading a book.

Figure 15:
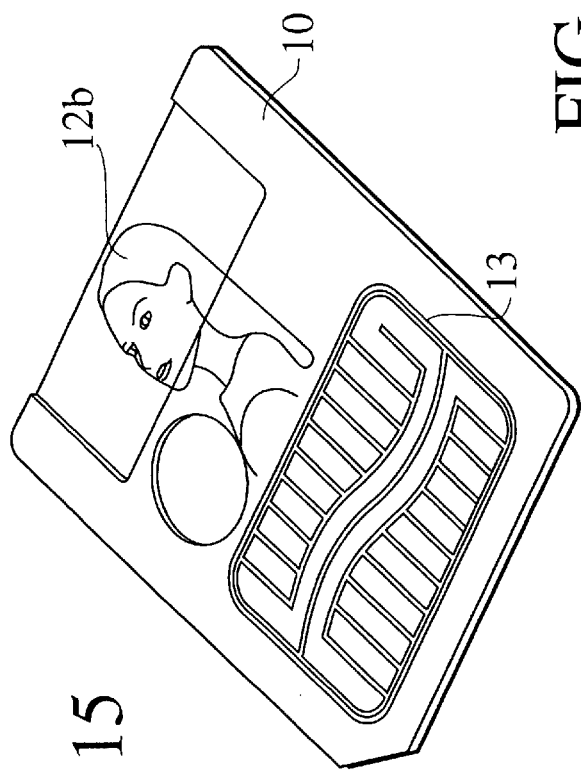
FIG. 15 is a perspective view showing a card-type storage device with another printed image.
Figure 17:
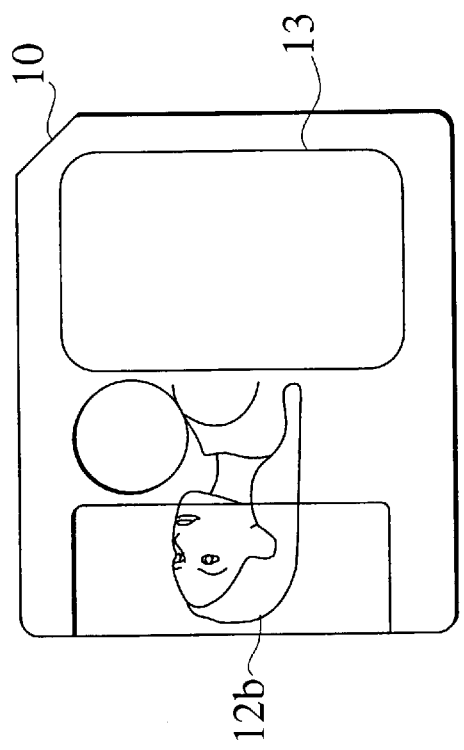
FIG. 17 is a back view showing a card-type storage device of FIG. 15.
Figure 16:
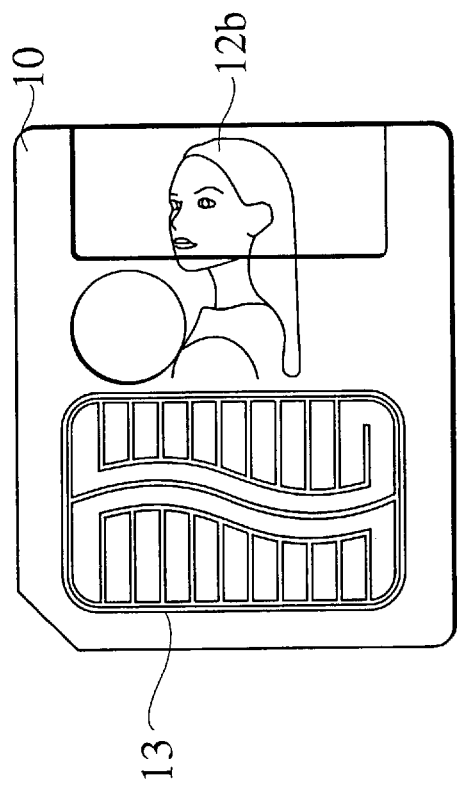
FIG. 16 is a front view showing a card-type storage device of FIG. 15.

Such an image is, for example, a photograph or picture of a singer who sings the music stored in the storage device in computer readable electronic format. FIG. 15 is a perspective view showing a picture 12b of a singer. FIG. 16 is a front view of FIG. 15, as well as FIG. 17 is a back view of FIG. 15.

The indication may be other than images. For example, the indication may be characters or letters. Such characters may be a code that uniquely identifies a particular music album by a particular singer or a particular book by a particular writer. Further, such characters may be just a title of a particular book.

To make the support frame member 11 and support sheet 12 transparent or translucent, they may be made from polycarbonate. The polycarbonate frame member 11 and sheet 12 hardly warp when they are bonded together into the frame 10, so that the frame 10 may be flat. One of the support frame member 11 and support sheet 12 may be made of polycarbonate, and the other polyester. This structure enables an image to firmly be printed on the frame 10.

Next, an example of processing a card-type frame 10 comprising transparent support frame member 11 and sheet 12 will be explained.

Figure 13:
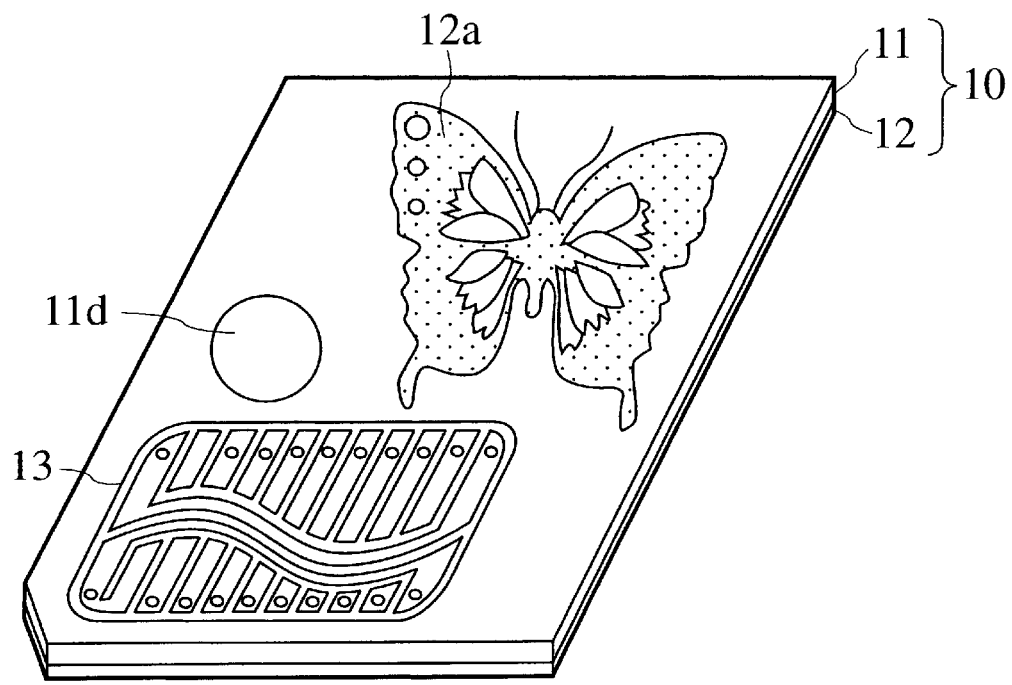
FIG. 13 is a top perspective view showing a card-type storage device having a transparent or translucent frame.
Figure 14:
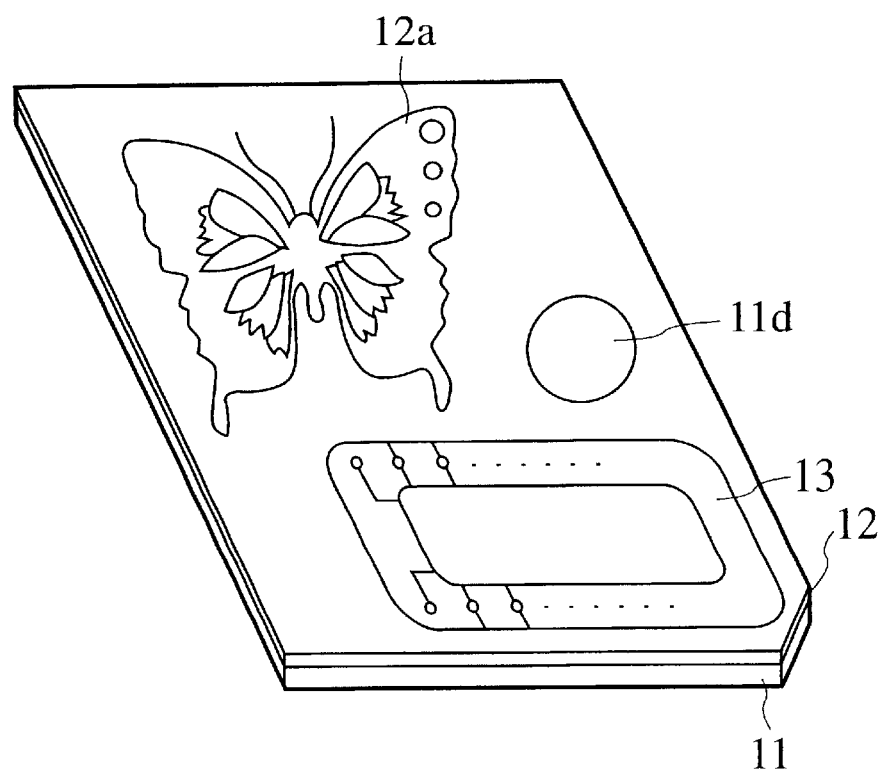
FIG. 14 is a bottom perspective view showing a card-type storage device having a transparent or translucent frame.

After a transparent or translucent sheet is cut into the support sheet 12 in step S12 of FIG. 6, an image 12a of, for example, FIG. 14 is printed on the support sheet 12 in step S12b. Thereafter, steps S13, S14, and S15 are successively carried out to complete the transparent or translucent frame 10. A user can see the image 12a through the transparent or translucent frame 10 as shown in a top perspective view of FIG. 13 and a bottom perspective view of FIG. 14. The image 12a is printed on the support sheet 12, and then, the support sheet 12 is bonded to the support frame member 11 to form the frame 10. This improves the value of the card-type storage device serving as a package medium, that is a package marketed with contents.

Instead of printing an image on the support sheet 12 in step S12b, an image may be printed on a sheet material that is not cut yet, in step S11b. Namely, step S11b prints the image 12a of FIG. 12 on the sheet material prepared in step S11 in a surface area where the support frame member 11 is to be bonded, and thereafter, step S12 cuts the sheet material into the support sheet 12.

Further, the image 12a may be preferably printed on the surface of the support sheet 12 that is to be bonded to the support frame member 11, so that the image 12a may withstand abrasion. Yet further, the surface of the support sheet 12 on which the image 12a is printed may be coated with a thin film to prevent adhesive agent from deteriorating or erasing the image 12a.

Second Embodiment

Figure 18:
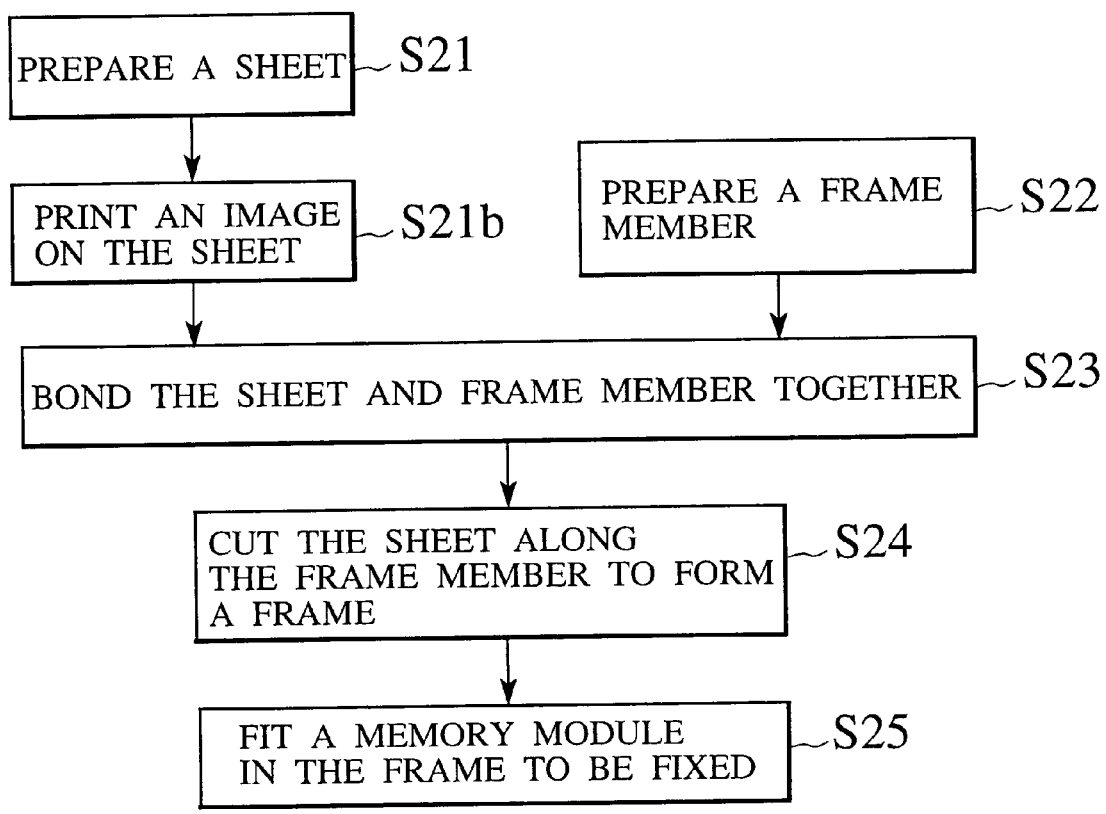
FIG. 18 is a process diagram generally showing process procedures according to a second embodiment of the present invention.
Figure 19A:
FIGS. 19A, 19B and 19C are sectional view explaining manufacturing steps of the second embodiment.
Figure 19B:
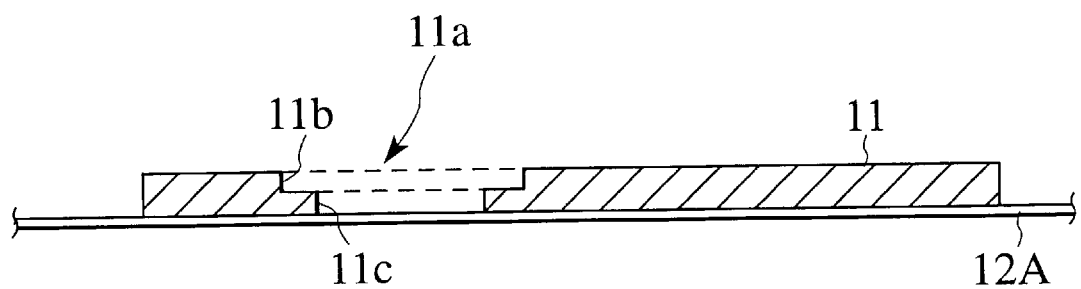
Figure 19C:
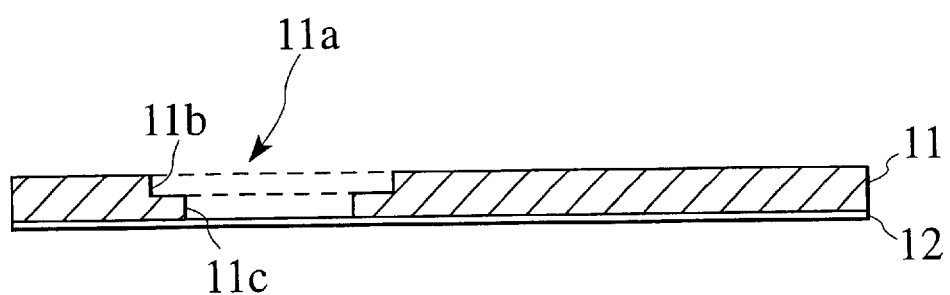

FIGS. 18 to 19C show a method of manufacturing a card-type storage device according to the second embodiment of the present invention. The difference of the second embodiment from the first embodiment will be explained.

FIG. 18 is a process diagram generally showing the manufacturing method of the second embodiment, and FIGS. 19A to 19C explain manufacturing processes of the second embodiment.

Step S21 prepares a sheet material 12A of 0.10 mm to 0.17 mm thick as shown in FIG. 19A. The size of the sheet material 12A is larger than the support frame member 11. Step S22 prepares the support frame member 11, which is the same as that of FIGS. 8 and 9.

Step S23 bonds a bottom surface of the support frame member 11 onto the sheet material 12A as shown in FIG. 19B. Step S24 cuts the sheet material 12A along the support frame member 11 as shown in FIG. 19C, to complete a card-type frame 10 like the one shown in FIGS. 10 and 11.

The last step S25 fits a memory module 13 to be fixed in an opening 11a of the support frame member 11 with the use of, for example, adhesive agent, to complete a card-type storage device like the one shown in FIG. 3.

In this way, the second embodiment prepares the large sheet material 12A, bonds the card-type support frame member 11 onto the sheet material 12A, and cuts the sheet material 12A along the support frame member 11. Unlike the first embodiment, the second embodiment requires no precision when attaching the support frame member 11 to the sheet material 12A, thereby making the manufacturing of a card-type storage device easier.

To print an image 12a, step S21 prepares the sheet material 12A first, and step S21b prints the image 12a in an area of the sheet material 12A where the support frame member 11 is to be bonded. Thereafter, step S23 bonds the support frame member 11 and sheet material 12A together, and step S24 cuts the sheet material 12A along the support frame member 11.

Like the first embodiment, it is preferable to print the image 12a on the surface area of the sheet material 12A that is to be bonded to the support frame member 11 and to coat the image-printed surface of the sheet material 12A with a thin film, to realize the effects of the first embodiment (FIGS. 13 and 14).

Third Embodiment

FIGS. 20 to 24 show a method of manufacturing a card-type storage device according to the third embodiment of the present invention. The difference of the third embodiment from the first and second embodiment will be explained.

Figure 20:
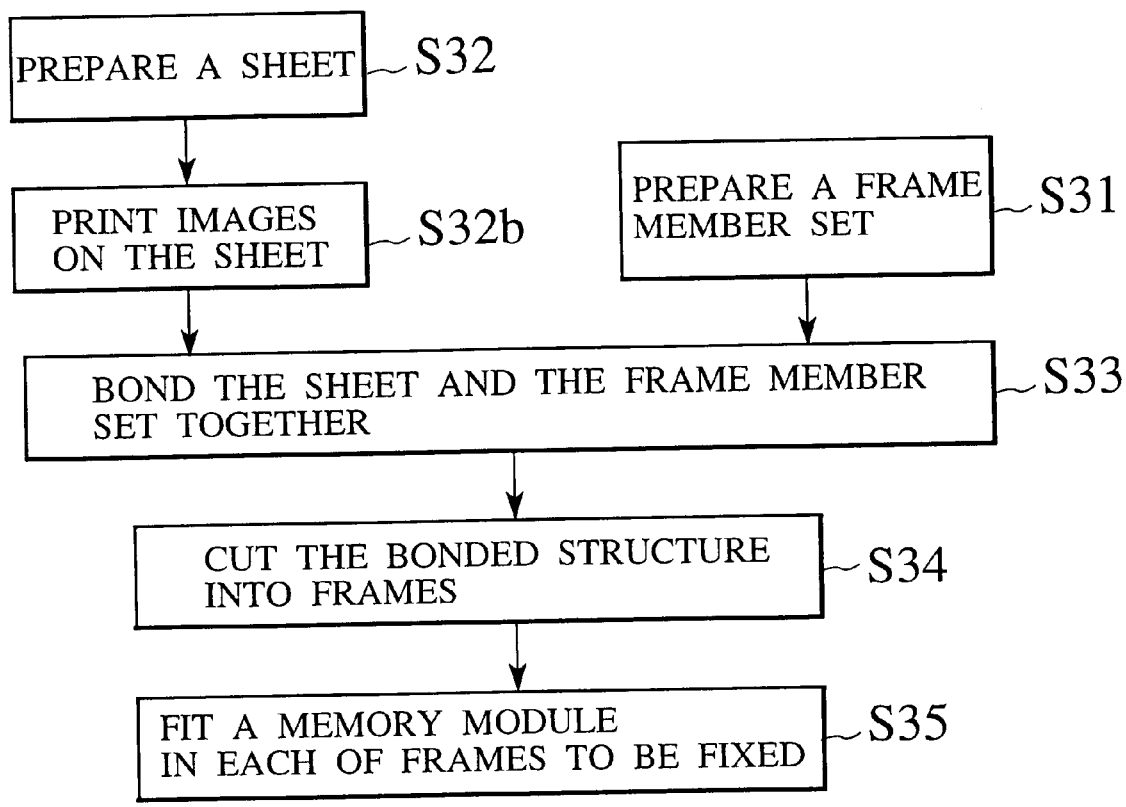
FIG. 20 is a process diagram generally showing process procedures according to a third embodiment of the present invention.

FIG. 20 is a process diagram generally showing the manufacturing method of the third embodiment, and FIGS. 21 to 24 explain manufacturing processes of the third embodiment.

Figure 21:
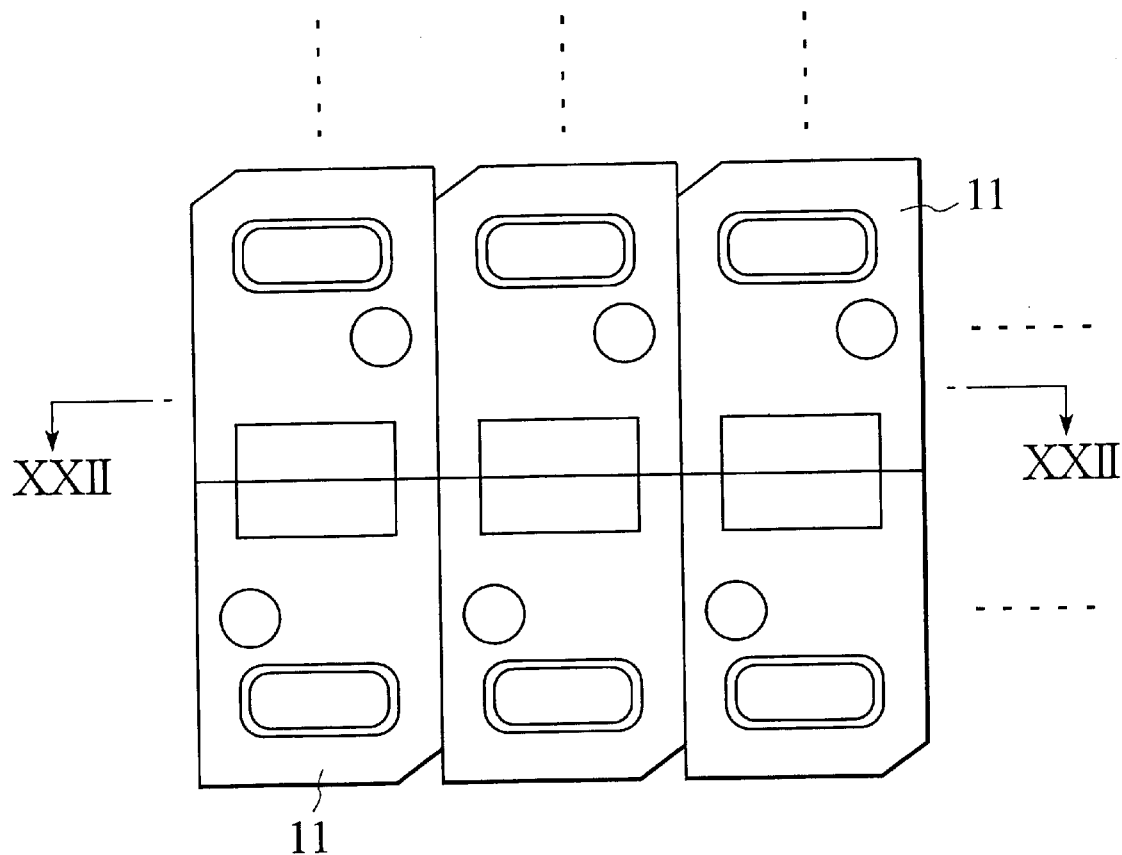
FIG. 21 is a plan view explaining manufacturing steps of the third embodiment.
Figure 22:
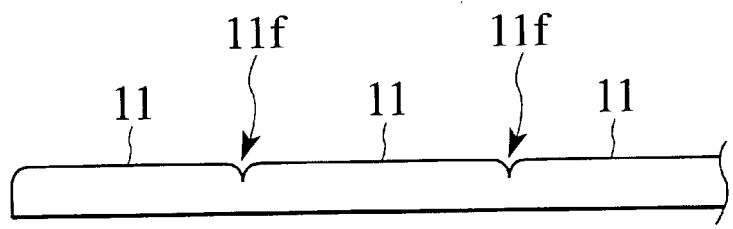
FIG. 22 is a sectional view taken along line XXII—XXII of FIG. 21 explaining manufacturing steps of the third embodiment.

Step S31 prepares, from resin, a frame member set made of consecutively joined card-type support frame members 11 as shown in FIG. 21. Each boundary between the adjacent frame members 11 is provided with a tapered cut 11f as shown in FIG. 22. At the same time, step S32 prepares a sheet material 12A whose size corresponds to the frame member set. The tapered cuts 11f make the following cut process easier, reduce stress on the support frame members 11, and provide smooth cut edges. The size of the sheet material 12A is substantially equal to or slightly larger than the size of the frame member set.

Figure 23:
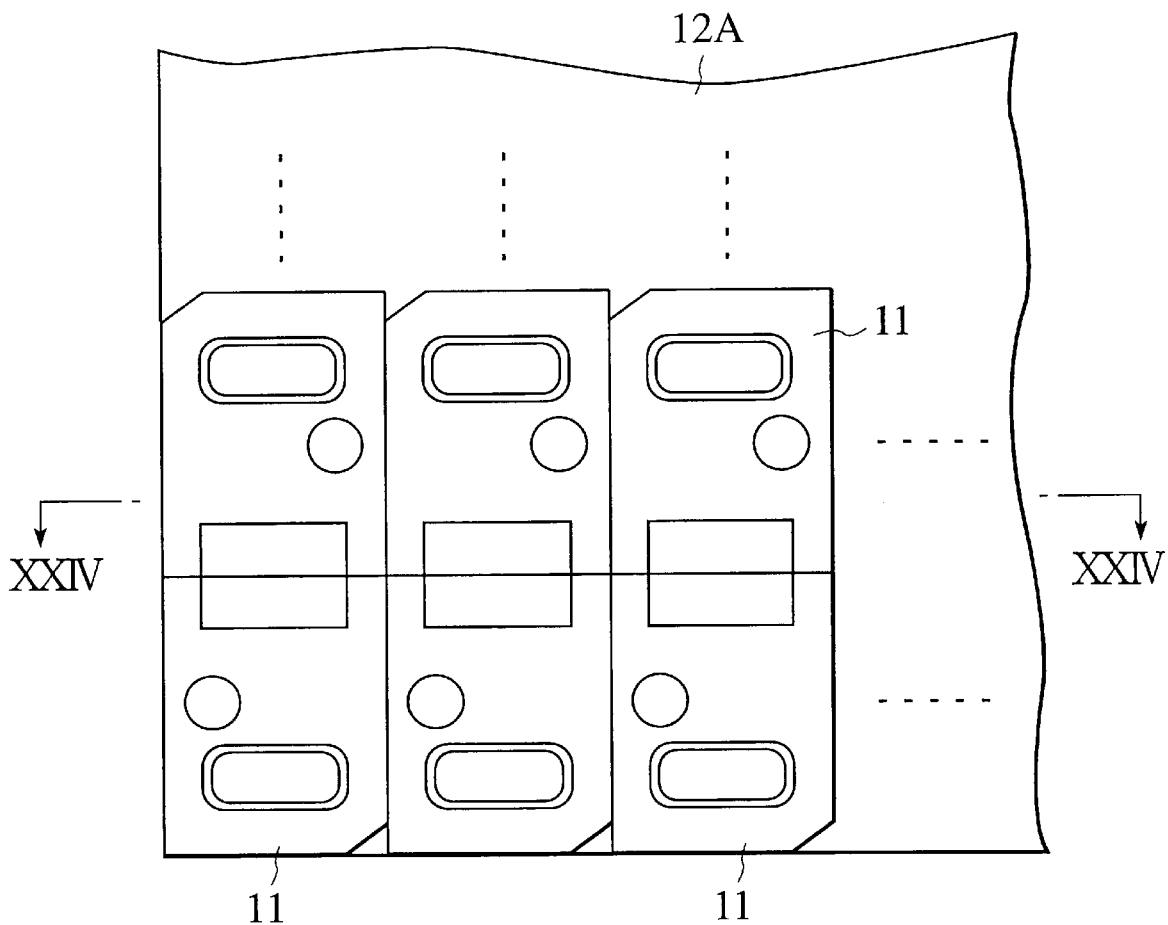
FIG. 23 is a plan view explaining another manufacturing steps of the third embodiment.
Figure 24:
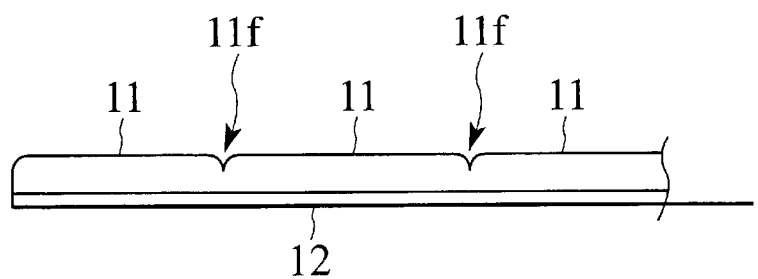
FIG. 24 is a sectional view taken along line XXIV—XXIV of FIG. 23 explaining another manufacturing steps of the third embodiment.

Step S33 bonds a bottom surface of the frame member set onto the sheet material 12A as shown in FIGS. 23 and 24. Step S34 uses the cuts 11f as guides to cut and separate the support frame members 11 and sheet material 12A from one another with the use of a metal mold, to simultaneously form card-type frames 10 each consisting of the support frame member 11 and a support sheet 12 attaching to the bottom of the support frame member 11.

The last step S35 fits a memory module 13 to be fixed in an opening 11a of the support frame member 11 of each of the frames 10 with the use of, for example, adhesive agent, thereby simultaneously providing card-type storage devices each having the structure of FIGS. 3 and 4.

In this way, the third embodiment prepares a frame member set consisting of card-type support frame members 11 from resin, bonds the frame member set onto a sheet material 12A, and simultaneously cuts the frame member set and sheet material into card-type frames. Consequently, the third embodiment simultaneously produces card-type storage devices each having the structure of FIGS. 3 and 4, to make the manufacturing of card-type storage devices easier and manufacturing costs lower compared with the first and second embodiments.

Printing an image 12a is carried out in the same manner as the second embodiment. Namely, step S32 prepares a sheet material 12A, and step S32b prints the image 12a in each area of the sheet material 12A where each frame member 11 is to be fixed. Thereafter, step S33 bonds a frame member set and the sheet material 12A together, and step S34 separates support frame members 11 from one another.

Like the first embodiment, it is preferable to print the images 12a on the surface of the sheet material 12A to be bonded to the frame member set and to coat the image-printed surface of the sheet material 12A with a thin film, to realize the effects of the first embodiment (FIGS. 13 and 14).

In each of the first to third embodiments, the thickness of the card-type support frame member 11 is equal to the thickness (0.665 mm) of the memory module 13. The thickness of the support frame member 11 may be thicker than the memory module 13 by about 0.01 mm to 0.10 mm. In this case, there will be a gap between the semiconductor memory 13b and the support sheet 12. The gap may relax warping force applied to the card-type storage device, to prevent a breakage of the memory module 13.

In FIGS. 13 and 14, the image 12a is printed on the support sheet 12 so that the image 12a may not overlap the write-protect area 11d of the support frame member 11 when the support frame member 11 and support sheet 12 are bonded together. The write-protect area 11d is an area where a write-protect conductive seal is attached to prohibit data stored in the semiconductor memory 13b from erroneously being rewritten. The conductive seal is made of adhesive paper coated with aluminum or stainless steel. Usually, the support frame member 11 is made of nonconductive material, and therefore, two electrodes are brought in contact with the write-protect area 11d to check the conductivity of a signal applied between the two electrodes and determine whether or not it is write-protected.

If the image 12a overlaps the write-protect area 11d, the area 11d may partly hide the image 12a when attaching the conductive seal to the write-protect area 11d. Although partly hiding the image 12a causes no electrical or functional problem, it is not preferable in terms of appearance. Accordingly, it is preferable to estimate and avoid the write-protect area 11d when printing an image on the support sheet 12. Namely, it is preferable to separate the image 12a from the write-protect area 11d.

Fourth Embodiment

Next, a novel card-type storage device manufactured according to the method of any one of the embodiments of the present invention will be explained.

According to the manufacturing method of the present invention, a card-type support frame member and a support sheet are separately prepared and are bonded together. Accordingly, the support frame member and sheet may be made of different materials and may have different colors. For example, the support frame member may be white and the support sheet red, to form a two-color card-type storage device. This technique enables users to distinguish card-type storage devices, which have the same dimensions and shapes and different functions, from one another. Among card-type storage devices, there are high-function storage devices that store individual identification (ID) data. Such high-function storage devices may be made in two-color structures, and low-function cards having no identification data in single-color structures, so that users may easily distinguish them from others.

In another case, card-type storage devices incorporating flash memories that are electrically programmable may be made in two-color structures, and card-type storage devices incorporating mask ROMs that are read-only may be made in single-color structures.

When providing a card-type support frame member and a support sheet with different colors, at least the support frame member may be transparent or translucent so that a user may see an image printed on the support sheet through the support frame member. The image may indicate contents to be stored in the storage device, so that the storage device itself may display identification data for the contents thereof. Unlike printing an image on a label and attaching the label to the storage device, the image serving as contents identification data printed on the storage device thereof is hardly deteriorated or erased.

In summary, as explained above in detail, the present invention cuts a sheet material into the size of a card-type support frame member and bonds the cut sheet to a bottom surface of the support frame member, to form a frame for a card-type storage device. The frame involves no thin part to be molded from resin, and therefore, is applicable even to form a so-called "SmartMedia" that is very small and thin. The supporter of the present invention is easy to manufacture from an extended range of resin materials with the use of existing metal molds and injecting machines.

Alternatively, the present invention prepares a sheet material larger than a card-type support frame member, bonds a bottom surface of the support frame member onto the sheet material, and then cuts the sheet material along the support frame member to form a frame. This frame provides the same effect as the above-mentioned frame. This technique eliminates a precise alignment between the sheet and the support frame member, to make the manufacturing of a card-type storage device easier.

Alternatively, the present invention prepares a frame member set consisting of consecutively joined card-type support frame members, bonds a bottom surface of the frame member set onto a sheet material, and then cuts the sheet-bonded frame member set along each of the support frame members, to simultaneously produce a plurality frames. In addition to the above-mentioned effects, this technique simultaneously manufactures a plurality of card-type storage devices to make the manufacturing of card-type storage devices easier and reduce the manufacturing costs of the storage devices.

The present invention extends a range of resin materials to manufacture card-type storage devices. Namely, the present invention enables transparent and translucent resin materials to be used for manufacturing support frame members and sheets to form transparent and translucent card-type storage devices.

According to the present invention, an image may be printed on a support sheet that forms a transparent or translucent frame of a card-type storage device, so that the image may be seen through the frame. This improves the value of the card-type storage device when marketed as a package medium.

The image-printed surface of the support sheet may be coated with a film so that the image may not be deteriorated or erased due to, for example, adhesive agent.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method of manufacturing a card-type storage device comprising the steps of:
   preparing a card-type support frame member having an opening, the opening comprising a recess and a through hole formed at the bottom of the recess, wherein the through hole is smaller than the recess;
   preparing a sheet material;
   cutting the sheet material the same size as the support frame member to form a support sheet;
   bonding the support sheet to a bottom surface of the support frame member to form a frame; and
   fixing an end portion of a circuit board configured as a part of a memory module in the recess of the opening of the support frame member, the memory module having at least one semiconductor memory electrically connected to the circuit board.

2. The method of claim 1, further comprising the step of:
   printing an image on the sheet material prepared at the sheet material preparing step on a surface area to be bonded to the support frame member to form an image-printed surface, the printing step being carried out before the cutting step.

3. The method of claim 2, wherein the image-printed surface of the support sheet is bonded to the bottom of the support frame member in the bonding step to form the frame.

4. The method of claim 2, further comprising the step of coating the image-printed surface area with one of a transparent and translucent film, the coating step being carried out before the cutting step.

5. The method of claim 4, further comprising the step of:
   printing an image on the support sheet cut in the cutting step to form an image-printed surface, the printing step being carried out before the bonding step.

6. The method of claim 5, wherein the image-printed surface of the support sheet is bonded to the bottom of the support frame member to form the frame.

7. The method of claim 5, further comprising the step of:

coating the image-printed surface area with one of a transparent and translucent film, the coating step being carried out before the cutting step.

8. The method of claim 5, wherein the support frame member has a write-protect area adapted for having applied a write-protect seal indicating that writing data into the semiconductor memory is prohibited.

9. The method of claim 8, wherein in the printing step, the image is printed on an area other than the write-protect area.

10. The method of claim 8, wherein in the support frame member preparing step the write-protect seal is affixed to the write-protect area.

11. The method of claim 6, further comprising the step of:

coating the image-printed surface area with one of a transparent and translucent film, the coating step being carried out before the bonding step.

12. The method of claim 1, wherein the opening is provided with a stepped area to hold the semiconductor memory and a flat external terminal of the memory module.

13. The method of claim 1, wherein at least one of the support frame member and sheet material is made from one of a transparent and translucent material.

14. The method of claim 13, wherein the support frame member and sheet material are made from materials including at least one of polycarbonate and polyester.

15. The method of claim 13, further comprising the step of:

printing an image on the sheet material prepared in the sheet material preparing step on a surface area to be bonded to the support frame member, so that the image may indicate information stored in the memory module.

16. The method of claim 2, wherein the support frame member has a write-protect area adapted for having applied a write-protect seal indicating that writing data into the semiconductor memory is prohibited.

17. The method of claim 16, wherein in the printing step, the image is printed on an area other than the write-protect area.

18. The method of claim 16, wherein in the support frame member preparing step the write-protect seal is affixed to the write-protect area.

19. A method of manufacturing a card-type storage device comprising the steps of:

preparing a card-type support frame member having an opening, the opening comprising a recess and a through hole formed at the bottom of the recess, wherein the through hole is smaller than the recess;

preparing a sheet material;

bonding a bottom surface of the support frame member onto the sheet material;

cutting the sheet material along the support frame member to form a frame made of the support frame member, the cut sheet material serving as a support sheet attached to the bottom surface of the support frame member; and fixing an end portion of a circuit board configured as a part of a memory module in the recess of the opening, the memory module having at least one semiconductor memory electrically connected to the circuit board.

20. The method of claim 19, further comprising the step of:

printing an image on the sheet material prepared at the sheet material preparing step on a surface area to be bonded to the support frame member, the printing step being carried out before the bonding step.

21. The method of claim 20, wherein the bottom surface of the support frame member is bonded onto the image-printed surface of the sheet material in the bonding step.

22. The method of claim 20, further comprising the step of:

coating the image-printed surface area with one of a transparent and translucent film, the coating step being carried out before the bonding step.

23. The method of claim 19, wherein the opening is provided with a stepped area to hold the semiconductor memory and a flat external terminal of the memory module.

24. The method of claim 19, wherein at least one of the support frame member and sheet material is made from one of a transparent and translucent material.

25. The method of claim 24, wherein the support frame member and sheet material are made from materials including at least one of polycarbonate and polyester.

26. The method of claim 19, further comprising the step of:

printing an image on the sheet material prepared in the sheet material preparing step on a surface area to be bonded to the support frame member, so that the image may indicate information stored in the memory module.

27. The method of claim 20, wherein the support frame member has a write-protect area adapted for having applied a write-protect seal indicating that writing data into the semiconductor memory is prohibited.

28. The method of claim 27, wherein in the printing step, the image is printed on an area other than the write-protect area.

29. The method of claim 27, wherein in the support frame member preparing step the write-protect seal is affixed to the write-protect area.

30. A method of manufacturing card-type storage devices comprising the steps of:

preparing, from resin, a frame member set made of consecutively joined card-type support frame members, each of the consecutively joined card-type support frame members having an opening, each opening comprising a recess and a through hole formed at the bottom of the recess, wherein the through hole is smaller than the recess;

preparing a sheet material having a size substantially equal to or larger than a size of the frame member set;

bonding a bottom surface of the frame member set onto the sheet material;

cutting the frame member set along the support frame members to form a plurality of frames, each one of the plurality of frames being made of the support frame member and the cut sheet material serving as a support sheet attached to the bottom surface of the support frame member; and fixing an end portion of a circuit board configured as a part of a memory module in the recess of each opening, the memory module having at least one semiconductor memory electrically connected to the circuit board sealed therein on a first surface of the memory module and a flat external terminal exposed on a second surface of the memory module.

31. The method of claim 30, further comprising the step of:

printing an image on the sheet material prepared in the sheet material preparing step on each surface area to be bonded to each support frame member of the frame member set to form an image-printed surface, the printing step being carried out before the bonding step.

32. The method of claim 31, wherein the bottom surface of the frame member set is bonded onto the image-printed surface of the sheet material in the bonding step.

33. The method of claim 31, further comprising the step of:
coating the image-printed surface with one of a transparent and translucent film, the coating step being carried out before the bonding step.

34. The method of claim 30, wherein the opening is provided with a stepped area to hold the semiconductor memory and a flat external terminal of the memory module.

35. The method of claim 30, wherein at least one of the frame member set and sheet material is made from one of a transparent and translucent material.

36. The method of claim 35, wherein the frame member set and sheet material are made from materials including at least one of polycarbonate and polyester.

37. The method of claim 30, further comprising the step of:
printing an image on the sheet material prepared in the sheet material preparing step on each area to be bonded to each support frame member of the frame member set, so that the image may indicate information stored in each memory module.

38. The method of claim 31, wherein each support frame in the frame member set has a write-protect area adapted for having applied a write-protect seal indicating that writing data into the semiconductor memory is prohibited.

39. The method of claim 38, wherein in the printing step, the image is printed on an area other than the write-protect area.

40. The method of claim 39, wherein in the frame member set preparing step the write-protect seal is affixed to each write-protect area.

41. A method of manufacturing a card-type storage device, including a card-type support frame member made of resin, a support sheet bonded to a bottom surface of the support frame member, and a memory module, the method comprising the steps of:
preparing the support frame member and a sheet material, the support frame member having an opening, the opening comprising a recess and a through hole formed at the bottom of the recess, wherein the through hole is smaller than the recess;
cutting the sheet material into the size of the support frame member to form the support sheet;
bonding the support sheet to the bottom surface of the support frame member to form a frame; and
fixing an end portion of a circuit board configured as a part of the memory module in the recess of the opening of the support frame member in the frame, the memory module having at least one semiconductor memory electrically connected to the circuit board.

42. A card-type storage device produced according to the method of claim 1.

43. A card-type storage device produced according to the method of claim 19.

44. A card-type storage device produced according to the method of claim 30.

45. A card-type storage device, comprising:
a card-type support frame member made of one of a transparent and translucent material, the support frame member having an opening, the opening comprising a recess and a through hole formed at the bottom of the recess, wherein the through hole is smaller than the recess;
a support sheet bonded to a bottom surface of the support frame member; and
a memory module having at least one semiconductor memory sealed therein on a first surface of the memory module, a circuit board, and a flat external terminal exposed on a second surface of the memory module, the card-type storage device being manufactured by the steps of:
preparing the support frame member and a sheet material;
cutting the sheet material into the size of the support frame member to form the support sheet;
bonding the support sheet to the bottom surface of the support frame member to form a frame; and
fixing an end portion of the circuit board in the recess of the opening of the support frame member in the frame.

46. A card-type storage device, comprising:
a frame including a card-type support frame member having an opening and made of resin and a support sheet bonded to a bottom surface of the support frame member, the opening comprising a recess and a through hole formed at the bottom of the recess wherein the through hole is smaller than the recess; and
a memory module including at least one semiconductor memory electrically connected to a circuit board, the circuit board having first and second surfaces and having an end portion fixed in the recess of the opening of the support frame member in the frame such that the second surface thereof aligns with a top surface of the frame.

47. The device of claim 46, wherein the support sheet has an image printed on the surface thereof bonded to the support frame member.

48. The device of claim 47, wherein at least one of the support frame member and support sheet is made from one of a transparent and translucent material.

49. The device of claim 47, wherein the support frame member has a write-protect area separate from an area where the image printed on the support sheet is present.

50. The device of claim 46, wherein the opening is provided with a stepped area to hold the semiconductor memory and a flat external terminal of the memory module.

51. The device of claim 46, wherein at least one of the support frame member and support sheet is made from one of a transparent and translucent material.

52. The device of claim 51, wherein the support frame member and support sheet are made from materials including at least one of polycarbonate and polyester.

53. The device of claim 46, wherein the frame is one of plurality of frames that are simultaneously produced.

54. A card-type storage device, comprising:
a card-type support frame member including a first area and a second area, the first area having an opening and at least a portion of the second area being made from one of a transparent and translucent material, the opening comprising a recess and a through hole formed at the bottom of the recess, wherein the through hole is smaller than the recess; and
a memory module fixed including at least non-volatile semiconductor memory and a circuit board, wherein said semiconductor memory contains certain information, and the second area has at least one of a picture and characters concerning said information, and an end portion of the circuit board is fixed in the recess of the opening.

55. The device of claim 54, wherein said information is digitized music information, and said picture indicates at least one of a singer and a player of the music.

56. A method of manufacturing a card-type storage device, comprising the steps of:

preparing a card-type support frame member having an opening which is formed convexly in a downward direction;

preparing a sheet material;

cutting the sheet material into the size of the support frame member to form a support sheet;

bonding the support sheet to a bottom surface of the support frame member to form a frame; and fixing an end portion of a circuit board configured as a part of a memory module in a step of the opening of the support frame member in the frame, the memory module having at least one semiconductor memory electrically connected to the circuit board, the sheet material and the semiconductor memory being not contacted therein.

57. A card-type storage device, comprising:

a frame including a card-type support frame member having an opening and being made of resin and a support sheet bonded to a bottom surface of the support frame member, the opening being formed convexly in a downward direction; and a memory module including at least one semiconductor memory electrically connected to a circuit board, an end portion of the circuit board being located in a step of the opening of the support frame member in the frame such that a surface thereof aligns with a top surface of the frame, the sheet material and the semiconductor memory being not contacted therein.

* * * * *